United States Patent [19]
Johnson et al.

[11] Patent Number: 6,162,655
[45] Date of Patent: Dec. 19, 2000

[54] METHOD OF FABRICATING AN EXPANDED BEAM OPTICAL WAVEGUIDE DEVICE

[75] Inventors: John Evan Johnson, New Providence; Leonard Jan-Peter Ketelsen, Clinton, both of N.J.; Janet L. Lentz, Sinking Spring, Pa.; Charles H. Joyner, Red Bank; Sharon Kay Sputz, Teaneck, both of N.J.

[73] Assignee: Lucent Technologies Inc., Murray Hill, N.J.

[21] Appl. No.: 09/228,218

[22] Filed: Jan. 11, 1999

[51] Int. Cl.[7] .................................................. H01L 21/302
[52] U.S. Cl. .................................................. 438/31; 438/40
[58] Field of Search ............................... 438/31, 40, 978, 438/FOR 458, FOR 492; 430/321

[56] References Cited

U.S. PATENT DOCUMENTS

| | | | |
|---|---|---|---|
| 5,574,742 | 11/1996 | Ben-Michael et al. | 372/45 |
| 5,720,893 | 2/1998 | Ben-Michael et al. | 216/24 |
| 5,910,012 | 3/2000 | Takeuchi . | |
| 5,985,685 | 11/1999 | Lealman et al. . | |
| 6,037,189 | 3/2000 | Goto . | |

OTHER PUBLICATIONS

T. L. Koch et al., *Tapered Waveguide* . . . , IEEE Photonics Tech. Lett., vol. 2, No. 2, pp. 88–90 (1990).

R. Ben–Michael et al., *InP Based* . . . , IEEE Photonics Tech. Lett., vol. 6, No. 12, pp. 1412–1414 (1994).

I. Moerman et al., *A Review* . . . , IEEE J. Selected Topics in Quantum Electr., vol. 3, No. 6, pp. 1308–1320 (1997).

*Primary Examiner*—George Fourson
*Attorney, Agent, or Firm*—Michael J. Urbano

[57] ABSTRACT

A method of fabricating an expanded beam optical waveguide device (e.g., a laser), comprises the steps of (a) forming a first semiconductor waveguide region having first and second sections of different thickness and an intermediate vertical taper section of varying thickness coupling the first and second sections to one another, the first waveguide region being effective to expand the size of the beam as it propagates from the first section to the second section, (b) forming a second semiconductor region (e.g., a laser active region) on the first waveguide region, (c) etching the second region so as to form an essentially vertical first surface of length A–B which extends obliquely across the propagation axis of the device, (d) forming a third semiconductor region (e.g., a cladding region) on the second region and over the first surface, and (e) etching an elongated mesa along the axis, the mesa extending through at least the second region and the first surface so as to form a second waveguide region having an oblique, essentially second vertical surface which has a length a–b<A–B and which is a subsection of the first surface, the second surface forming an asymmetric horizontal taper effective to optically couple the beam between the second waveguide region and the first waveguide region. Also described is a monolithically integrated optical amplifier and electroabsorption modulator with a dual waveguide expanded beam device fabricated by the inventive method.

5 Claims, 6 Drawing Sheets

METHOD OF FABRICATING AN EXPANDED BEAM OPTICAL WAVEGUIDE DEVICE

FIELD OF THE INVENTION

This invention relates generally to semiconductor optical waveguide devices and, more particularly, to a method of fabricating a class of such devices which expand the output beam and thereby facilitate coupling to other devices, such as optical fibers.

BACKGROUND OF THE INVENTION

In typical optoelectronics applications light generated by a semiconductor laser is coupled to a glass (silica) optical fiber. However, the mismatch in optical mode dimensions between these two components (~1 $\mu$m for the laser and ~7 $\mu$m for the fiber) makes direct coupling between them inefficient (e.g., only ~10% of the light would be coupled into the fiber). Therefore, one or more lenses are typically introduced between the laser and the fiber to match the modes and improve the coupling efficiency to ~50%. But this type of optical assembly requires tight alignment tolerances (~0.2 $\mu$m). Achieving such tolerances is accomplished routinely in the optoelectronics industry, but the added complexity introduces significant cost to the end product. Most telecommunications applications can easily support the additional cost, but more commodity-oriented applications, such as data communication, cannot.

The prior art has attempted to address this problem by designing the semiconductor laser to include a monolithically integrated beam expander which performs the desired mode size conversion internal to the laser. This design eliminates the need for any bull optical components, such as lenses, between the laser and the fiber. In addition, alignment tolerances are increased by an order of magnitude to several micrometers, thereby significantly reducing packaging cost.

Expanded beam lasers also find application in conjunction with planar waveguide devices where a mode mismatch problem also exists. The use of an expanded beam laser reduces this problem and provides technologically obtainable laser component bonding tolerances of ~2 $\mu$m; i.e., the tolerance by which a laser component is positioned on and bonded to a submount (e.g., a silicon optical bench) relative to an optical waveguide or an optical fiber. The ability to mate active and passive components via expanded beam technology is one pathway to higher levels of component functionality. Increased functionality finds many applications such as wavelength selectable lasers, wavelength transponders and optical interconnects.

In the prior art beam expansion is achieved by judicious use of waveguide tapers. In a typical semiconductor laser the vertical waveguide dimension is much smaller than the wavelength of the laser light being confined by the waveguide. In this case thinning the vertical waveguide dimension results in increasing the vertical optical beam size. On the other hand, the lateral waveguide dimension of such a laser is on the order of the wavelength of the laser light. In this case beam expansion can be achieved either by widening the waveguide or by narrowing it. In many designs vertical and lateral (horizontal) tapers are combined to achieve the desired beam expansion in both vertical and horizontal directions. These tapers are gradual to ensure an adiabatic (low optical loss) transition of the optical mode from a relatively small size to a larger size.

Most expanded beam lasers reported in the prior art literature are constructed in a serial fashion; i.e., the laser section is followed by a passive waveguide section. This design is dictated by the need for a strong overlap of the optical beam with the gain (active) medium. One of the principal difficulties in realizing a practical expanded beam laser lies in monolithically integrating a standard laser section, which generates the laser light, with some form of tapered waveguide section which expands the beam without introducing significant optical loss. Illustrative of the prior art literature are the following articles all of which are incorporated herein by reference: R. Ben-Michael et al., *IEEE Photon. Tech. Lett.*, Vol. 6, No. 12, pp. 1412–1414 (1994), I. Moerman, *IEEE J. Selected Topics in Quantum Electron.*, Vol. 3, No. 6, pp. 1308–1320 (1997), and R. Ben-Michael et al., U.S. Pat. Nos. 5,574,742 and 5,720,893 issued on Nov. 12, 1996 and Feb. 24, 1998, respectively.

Both the taper formation and the concatenation of the two sections of a monolithically integrated expanded beam laser involves technology that is not available in present manufacturing processes for optoelectronic devices. Thus, a need remains in the art for a reliable fabrication process that is capable of producing expanded beam devices without introducing significant optical loss or significant manufacturing cost.

SUMMARY OF THE INVENTION

This need is addressed in accordance with one aspect of our invention, a method of fabricating an expanded beam optical waveguide device, comprising the steps of: (a) forming a first semiconductor waveguide region having first and second sections of different thickness and an intermediate, vertical taper section of varying thickness coupling the first and second sections to one another, the first waveguide region being effective to expand the size of the beam as it propagates from the first section to the second section, (b) forming a second semiconductor region (e.g., a laser active region) on the first waveguide region, (c) etching the second region so as to form an essentially vertical first surface of length A–B which extends obliquely across the propagation axis of the device, (d) forming a third semiconductor region (e.g., a cladding region) on the second region and over the first surface, and (e) etching an elongated mesa along the axis, the mesa extending through at least the second region and the first surface so as to form a second waveguide region having an oblique, essentially vertical second surface which has a length a–b<A–B and which is a subsection of the first surface, the second surface forming an asymmetric horizontal (i.e., lateral) taper effective to optically couple the beam between the second waveguide region and the first waveguide region.

BRIEF DESCRIPTION OF THE DRAWING

Our invention, together with its various features and advantages, can be readily understood from the following more detailed description taken in conjunction with the accompanying drawing, in which.

In the interest of clarity and simplicity, FIGS. 1–14 have not been drawn to scale. In addition, when describing physical or optical dimensions, the symbol A stands for Angstroms, whereas when describing electric current, it stands for Amperes.

DETAILED DESCRIPTION OF THE INVENTION

Device Structure

Figure 1:
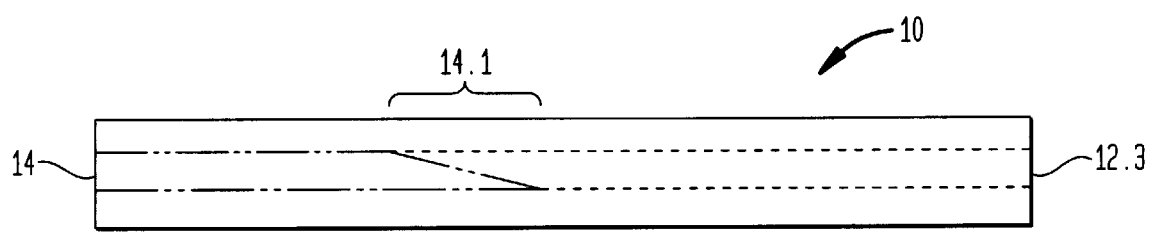
FIG 1 is a schematic, top view of an expanded beam optical waveguide device fabricated in accordance with one embodiment of our invention.
Figure 2:
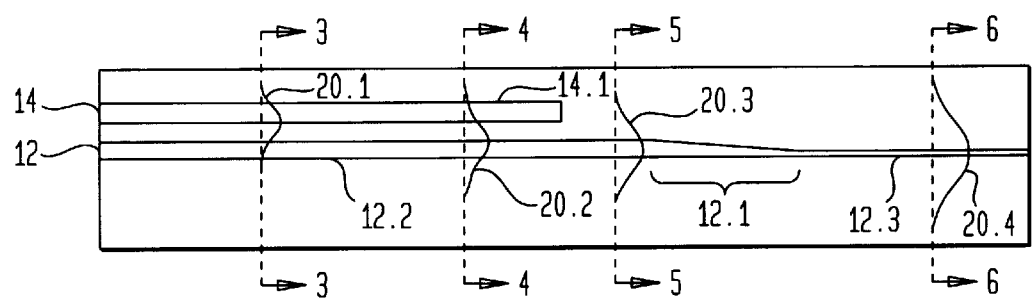
FIG. 2 is a schematic, side view of the device of FIG. 1.
Figure 3:
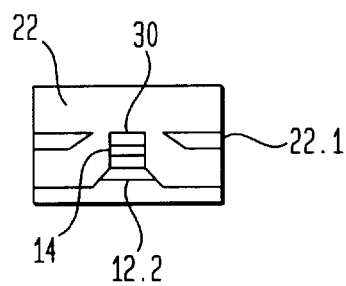
FIGS. 3–6 are schematic cross-sectional views taken along lines 3—3, 4—4, 5—5 and 6—6, respectively, of the device of FIG. 2.
Figure 4:
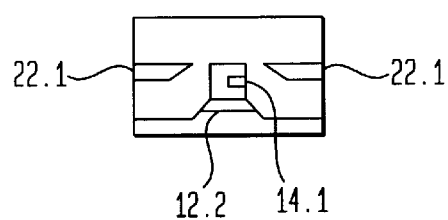
Figure 5:
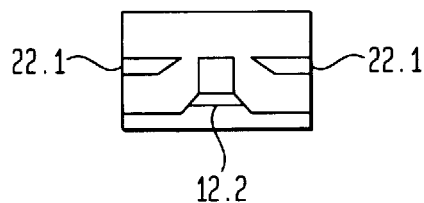
Figure 6:
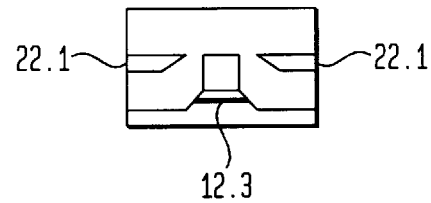

With reference now to FIGS. 1–6, we show an optical beam expander device 10 comprising a first, lower semiconductor waveguide region 12 having a vertical taper section 12.1 and a second, upper semiconductor waveguide region 14 having a lateral (or horizontal) taper section 14.1. The dual waveguides are optically coupled to one another via the lateral taper section 14.1, and the beam, which propagates from left to right in FIGS. 1–2, is expanded via the vertical taper section 12.1 and the thinner waveguide section 12.3. The term region as used herein is intended to cover single layers, multiple layers, or partial layers. The output end of the lower waveguide region is in turn coupled to a utilization device (not shown); for example, a silica optical waveguide integrated on a submount (e.g., a silicon optical bench) or a silica optical fiber.

Illustratively, as shown in FIGS. 3-6 the waveguide regions 12 and 14 are integral parts of an elongated semiconductor mesa (or ridge) 30 which is buried in a matrix 22 of semiconductor material. Typically matrix 22 includes material having a lower refractive index than mesa 30 (or the average refractive index of its component layers) in order to provide horizontal confinement of the propagating beam. In addition, in those applications where it is desired to apply electric current to device 10, the matrix 22 may also be provided with current confinement zones 22.1 which serve to steer current flow through mesa 30. This design is highly advantageous, for example, where device 10 is a laser, in which case upper waveguide region 14 would include the active region of the laser. The laser itself may be any one of myriad laser types well known in the art; e.g., standard double heterostructure (DH) lasers, multi-quantum well (MQW) lasers, or intersubband lasers (e.g., quantum cascade (QC) lasers), all of which may be fabricated in any one of numerous buried heterostructure (BH) configurations (e.g., covered or clapped mesa BH lasers known as CMBH lasers). Typically, but not exclusively, these laser are fabricated from Group III–V compound semiconductors such as InGaAsP/InP (for operation a wavelengths of ~1.1–1.55$\mu$m), GaAs/AlGaAs (for operation a wavelengths of ~0.8–0.9 $\mu$m), or GaInAs/AlInAs (for operation a wavelengths of ~3–13 $\mu$m in intersubband lasers).

The expansion of the beam is depicted by the progression of the optical mode (i.e., intensity profiles 20) from left to right in FIG. 2. Thus, at location 3—3 the profile 20.1 shows that most of the energy of the mode is located in upper waveguide region 14. However, as the mode propagates to location 4—4, which is within the lateral taper section 14.1, a significant fraction of the mode energy has transferred into the lower waveguide region 12.2, as indicated by the intensity profile 20.2. Still further along at location 5—5, where the upper waveguide region no longer exists, the mode is essentially centered in waveguide region 12.2 as shown by profile 20.3. After passing through vertical taper section 12.1, the lower waveguide section 12.3 becomes thinner causing the mode to spread further as depicted by profile 20.4. The expanded profile facilitates efficient coupling to other optical devices, including, for example, optical fibers. In order to keep optical losses (e.g., free carrier absorption) relatively low, care should be exercised in the fabrication process to avoid the introduction of any significant amount of dopant into the lower waveguide region 12.

The typical size and aspect ratio (rise to run) of the vertical and lateral tapers cannot be accurately shown in the figures due to space constraints. However, it is important to note that the lateral taper is relatively short (e.g., 10–40 $\mu$m) and has a relatively small aspect ratio (e.g. 1:20), whereas the vertical taper is more gradual and hence much longer (e.g., 75–300 $\mu$m) with a much higher aspect ratio (e.g., 1:3000). These dimensions are illustrative only inasmuch as tapers with different lengths and other aspect ratios can readily be fabricated in accordance with our inventive process.

It should be noted that the lower waveguide 12 need not have a uniform width over its entire length; e.g., the width of region 12.3 may increase gradually (i.e., fan out) toward the output face. The fan out may be symmetrical or asymmetrical with respect to the propagation axis. This embodiment of our invention provides an additional degree of freedom in matching the mode in the beam expanded device to the mode in the utilization device to which it is coupled.

Device Fabrication

Figure 7:
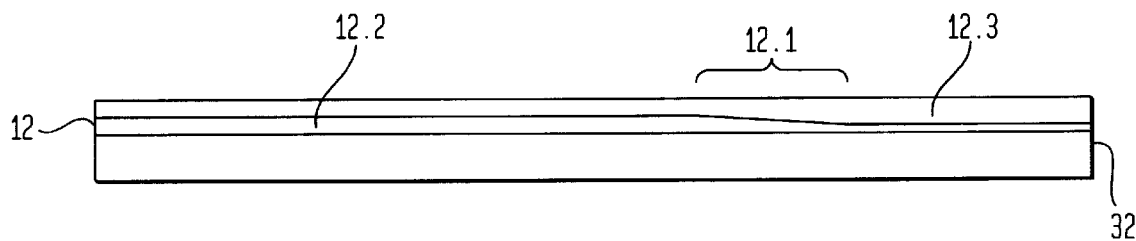
FIGS. 7–8 are schematic top and side views, respectively, of an expanded beam device at an intermediate stage of fabrication used to demonstrate the use of selective area growth (SAG) to realize the vertical taper section.
Figure 8:
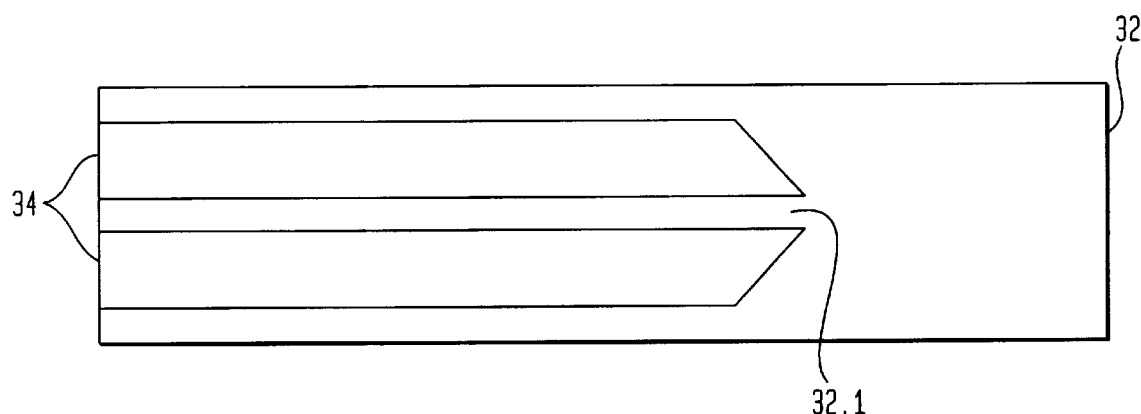

In accordance with one aspect of our invention, an expanded beam optical device of the type depicted in FIGS. 1–6 is fabricated by a unique process that begins with providing a semiconductor body 32 as shown in FIGS. 7–8 and forming the first waveguide region 12 thereon. The semiconductor body may be a single crystal semiconductor substrate (e.g., an InP substrate available from commercial sources), or it may include such a substrate with one or more epitaxial layers grown thereon. In either case, a pair of spaced, elongated dielectric regions (e.g., $SiO_2$ or $Si_3N_4$ pads) are deposited or otherwise formed on the top surface of the body 32. These dielectric regions serve two functions: they prohibit, or at least inhibit, epitaxial growth of semiconductor material directly thereon, and they enhance the growth rate of semiconductor material in the gap 32.1 between the elongated regions 34. Therefore, when the first, lower waveguide region 12 is epitaxially grown over the dielectric-coated body, the waveguide grows at lower rate in the section 12.3, which is located outside the dielectric regions, and grows at a higher rate in the section 12.2, which is located in the gap between the dielectric regions. In the intermediate section 12.1, which is adjacent the ends of the dielectric regions, the growth varies between the higher and lower rates discussed above. (The slanted ends of the dielectric regions are not Johnson 6-19-8-1-3 essential; square ends or other shapes may be used.) Consequently, for a given growth time, the section 12.3 grows to a smaller thickness than the section 12.2, and the intermediate section varies in thickness; i.e., it forms a vertical taper. This process is well known in the art as selective area growth (SAG). See, articles on SAG cited in Moerman et al, supra, which are also incorporated herein by reference.

Figure 9:
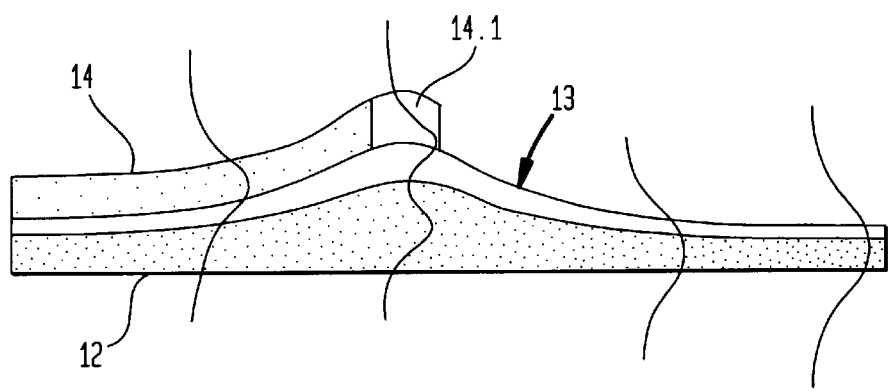
FIG. 9 is a schematic side view of the dual waveguide layers similar to those of FIG. 2 but depicting the varying thickness that is typically obtained when the vertical taper section is fabricated utilizing SAG process in accordance with a preferred embodiment of our invention; also shown are the intensity profiles of the optical mode at various locations along the tapered section.

When using SAG, the vertical taper in lower waveguide region 12 may actually take on the appearance of a bulge, or a two-side taper, as shown in FIG. 9. (Illustratively, this bulge corresponds to the slightly curved segment between $-300\,\mu m$ and $-400\,\mu m$ of the profile of FIG. 15. For efficient coupling, the upper waveguide region is preferably terminated at or near to the top of the bulge, although the precise position is not critical.) Although SACR is currently the preferred process for forming the vertical taper section, other techniques well known in the art are suitable. For example, the lower waveguide region 12 may contain etch-stop layers embedded within it to allow the controlled removal of increasingly thinner layers from the section 12.1, with sequentially displaced masking, to ultimately form a staircase profile. This technique is described by T. L. Koch et al., in *IEEE Photon. Tech. Lett.*, Vol. 2, No. 2, pp. 88–90 (1990), which is incorporated herein by reference.

Figure 10:
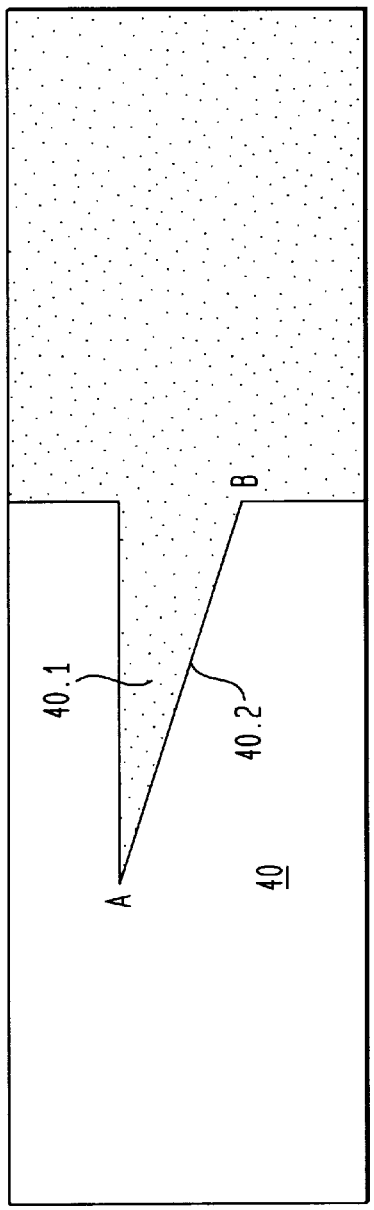
FIGS. 10–11 are schematic top and side views, respectively, of an expanded beam device at another intermediate stage of fabrication used to demonstrate an illustrative photolithographic mask used in the etching of the oblique surface A–B used to form the horizontal taper.
Figure 11:
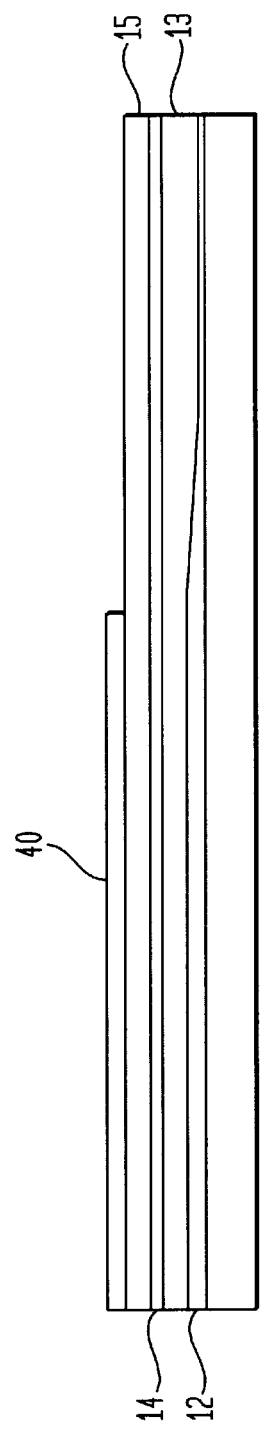
Figure 12:
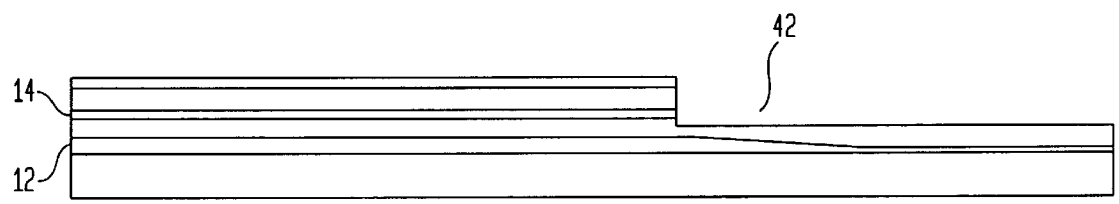
FIG. 12 is a schematic side view of the expanded beam device of FIGS. 10–11 after the etching of the oblique surface A–B has been completed.
Figure 13:
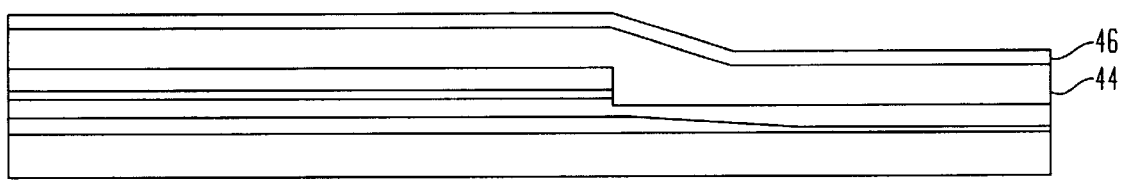
FIG. 13 is a schematic side view of the expanded beam device after a cladding region has been regrown over the etched device of FIG. 12.

In any event, the fabrication process continues, as shown in FIGS. 10–11 with the epitaxial growth of the following: a spacer region 13 on the lower waveguide region 12, the upper waveguide region 14 on the spacer region 13, and a cladding region 15 on the upper waveguide region 14. Then, a suitable mask 40 (e.g., a photolithography mask such as photoresist) is deposited on the cladding layer 15. Mask 40 is shaped to have an oblique edge 40.2 of length A–B. This edge will serve to define the lateral taper, as discussed below. Alter the mask 40 is shaped, the device is etched to remove semiconductor material in the region 42 (FIG. 12) that is not covered by the mask. As shown, the device is etched to a depth that extends through the upper waveguide region 14 but not the lower waveguide region 12 and forms an essentially vertical surface of length A–B that extends obliquely across the propagation axis. Then, cladding layers 44 and 46 are epitaxially regrown over the etched structure (FIG. 13).

Figure 14:
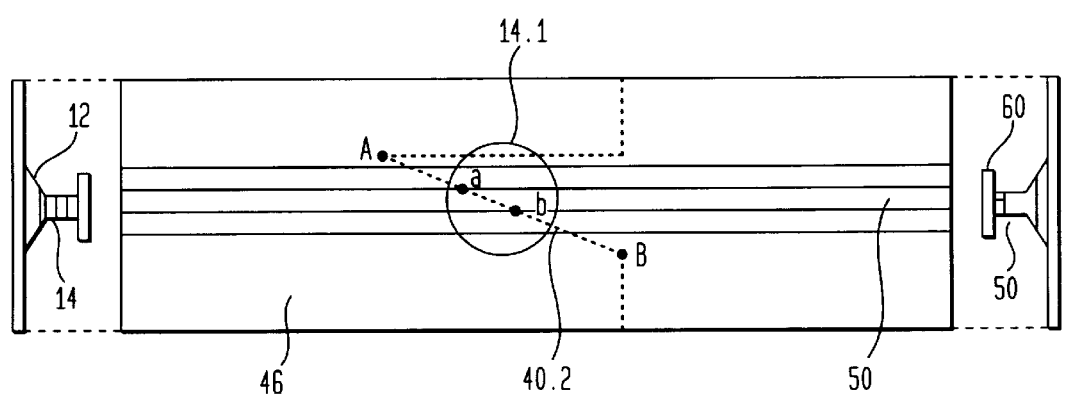
FIG. 14 shows schematic top and end views of an expanded beam device after an elongated waveguide mesa has been etched along the propagation axis and through the oblique surface A–B to form a horizontal taper a–b.

An elongated mesa 50, as shown in FIG. 14 (end views), is defined by forming an elongated dielectric mask 60 (e.g., a $SiO_2$ or $Si_3N_4$ mask) on the cladding la) er 46. The structure is then etched to form the desired mesa 50. (Typically the mesa is narrow enough to ensure single transverse mode operation of the laser under normal operating conditions.) Importantly, the width of mask 60 is sufficiently small that it intersects the edge 40.2 at interior points a & b which lie between end points A & B. Feature 40.1 of mask 40 is shown to be triangular for illustrative purposes only; i.e., it may have other shapes as long as it contains an oblique edge 40.2. Likewise, edge 40.2 need not be a straight line (e.g., it could be curved) provided it is longer than the width of the intended mesa. Thus, the lateral taper section 14.1 is formed as a subsection of length a–b of the previously-described oblique, essentially vertical surface. Thus, the subsection is itself also an oblique, essentially vertical surface, where clearly a–b<A–B.

The elongated mesa structure is typically completed by regrowing a matrix of semiconductor material, including well-known current blocking regions, as previously discussed with reference to FIGS. 3–6.

For several reasons, it is significant that the edge 40.2 be formed before the mesa 50 is etched. First, if the mesa were formed before the lateral taper, the structure would be non-planar at the time the mask 40 is deposited to define the lateral taper section, thereby complicating the masking process. Second, the end (designated as point a in FIG. 14) would tend to be blunt, rather than sharp, thereby reducing coupling efficiency between the upper and lower waveguide regions. Third, if the mesa were formed first, then, after etching the taper section, the portion of the mesa over the lower waveguide region 12.3 would be missing, thereby exposing the lower waveguide region 12.3 to contamination by dopants in subsequent epitaxial regrowth steps and hence to increased free carrier absorption.

An important aspect of our invention is its ability to robustly product devices with low, tightly controlled optical losses. In order to achieve low mode transfer loss between the upper waveguide region 14 and the lower waveguide region 12, the lateral taper should be placed over the thickest portion of the lower waveguide region. In one embodiment, displacement of the lateral taper to a region of about 5% thinner lower waveguide results in an increase in loss of less than about 0.3 dB.

The longitudinal position (along the propagation axis) of the lateral taper is determined by the photolithography and etching process biases of edge 40.2 and by the relative misalignment between mask 50 and mask 40. Control of the process bias to ±0.5 μm and the relative misalignment to ±0.5 μm are readily achieved using conventional fabrication techniques. Relative angular misalignment between layers is virtually nonexistent in practice because widely separated (e.g., >3 cm) alignment marks are typically used on the wafer. For an illustrative 1:20 lateral taper, a combination of misalignment in the lateral direction and/or change in process bias of ±1 μm will result in a ±20 μm shift in the resulting longitudinal position of the lateral taper. A misalignment of ÷1 μm in the longitudinal direction simply results in ±1 μm shift.

Figure 15:
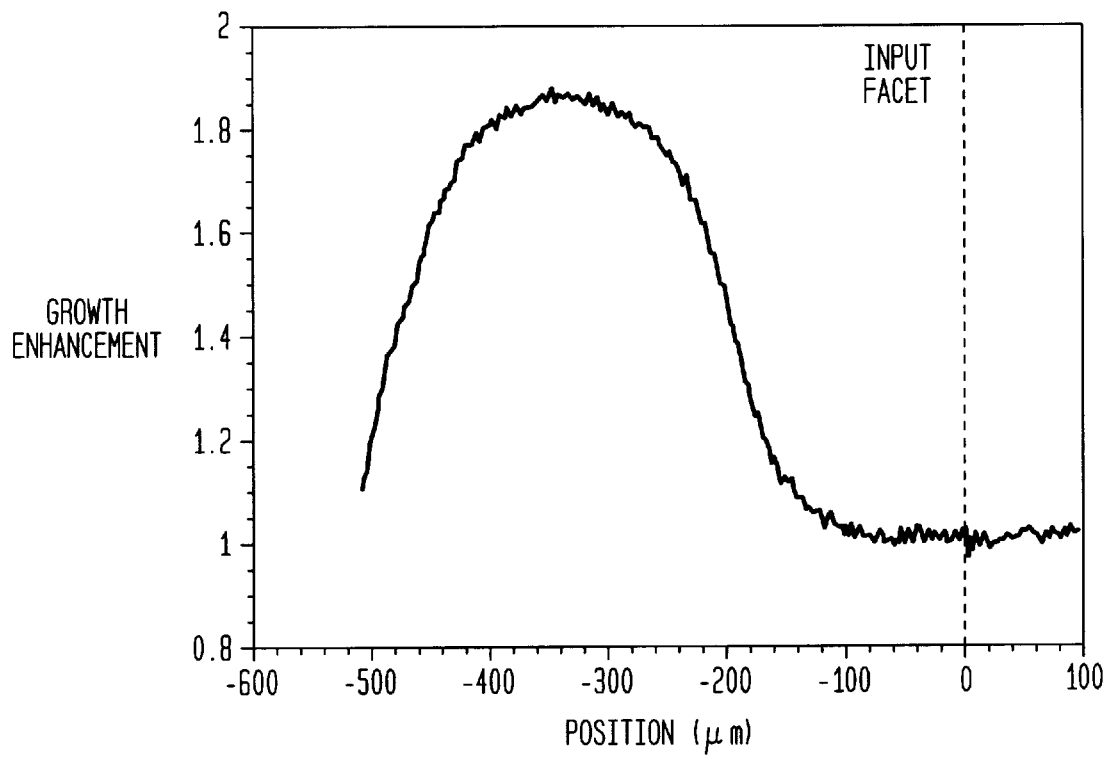
FIG. 15 is a graph showing the growth-rate enhancement profile of a beam expander lower waveguide structure fabricated using SAG.

As illustrated by FIG. 15, the SAG process can produce a vertical taper profile with a thick, substantially flat region about 100 μm long in which the thickness varies by less than about 5%. Flat regions of similar length may be readily obtained when using techniques other than SAG to fabricate the vertical taper. The process is robust because this flat, thick region is much broader than the capability of longitudinal placement of the lateral taper, which is ±20 μm in the illustrative example above. This process robustness results in a tight control of the optical losses in expanded beam devices fabricated with the our inventive process.

EXAMPLE

This example describes the fabrication of a Group III–V compound semiconductor expanded beam optical waveguide device, of the type describe above, which is used to couple a monolithically integrated optical amplifier and electroabsorption (EA) modulator to a single-mode fiber or to a planar waveguide in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

The device was fabricated using an organo-metallic vapor phase epitaxy (OMVPE) process, two of which were SAG steps. Before the first epitaxial growth, two rectangular $SiO_2$ pads 300 $\mu$m long by 80 $\mu$m wide separated by a 20 $\mu$m gap were formed on an n-type InP substrate in the vicinity of the intended lateral taper section. Then three layers were grown on the $SiO_2$-patterned substrate: an n-type InP buffer layer, an n-type, 1000 A thick InGaAsP (1.17 $\mu$m bandgap) lower waveguide layer, and an n-type, 550 A thick InP spacer layer. Quaternary InGaAsP layers will hereinafter be referred to as Q layers. The first set of oxide pads caused a growth rate enhancement of 1.9× and a 50 nm bandgap shift of the lower waveguide layer in the middle of the gap between the oxide pads.

FIG. 15 shows the thickness profile measured along the propagation axis using an interferometric surface profiler. After the growth of the foregoing epitaxial layers was completed, the first set of oxide pads was removed (e.g., stripped) and a second set of oxide pads was formed on the structure (i.e., wafer) in the amplifier region. The latter pads were 550 $\mu$m long by 15 $\mu$m wide separated by a 20 $\mu$m gap. Epitaxial growth was then continued as follows: an n-type, 300 A thick InP buffer layer was grown on the oxide-patterned wafer; a multi-quantum well (MQW) separate confinement heterostructure (SCH) stack of layers was grown on the buffer layer, and a p-type, 2000 A thick InP cladding layer was grown on the MQW-SCH stack.

The MQW-SCH stack, designed for laser operation at about 1.55 $\mu$m, comprised seven strained Q layer quantum wells interleaved with six strained Q layer barriers, sandwiched between upper and lower separate confinement Q layers.

This SAG process produced a bandgap difference of about 65 nm between the EA modulator and the amplifier, as measured with small-spot photoluminescence.

After removing the second set of oxide pads, the lateral taper section was formed. A photoresist mask with a triangular feature was formed on the wafer. The feature included an oblique edge having a 1:20 aspect ratio. Then, a two step selective etch was used to remove the p-InP cladding and the MQW-SCH layers from the beam expander region. In additional p-type, 4000 A thick cladding was then grown over the etched surface. This step was followed by conventional capped (or covered)-mesa buried heterostructure (CMBH) processing to form an elongated, 1 $\mu$m wide mesa (or ridge) along the propagation axis (similar to the discussion of FIG. 14). The CMBH processing included growth of well known semi-insulating (Fe-doped) InP layers (similar to regions 22.1 of FIGS. 3–6) as well as a p-type, 3 $\mu$m thick InP cladding layer and a p-type, 1000 A thick InGaAs cap layer (not shown at the top of matrix 22 of FIGS. 3–6). Where the 1 $\mu$m wide active stripe intersected the angled lateral taper edge, a 20 $\mu$m long asymmetric lateral taper was formed.

A combination of well known $CH_4$:$H_2$ reactive ion etching and wet chemical etching was then used to electrically isolate the amplifier and modulator sections from one another. This isolation was accomplished by removing the highly conductive upper cladding layers and forming a trench around the active mesa stripe. A $SiO_2$ dielectric layer was then deposited, and p-type ohmic contacts were formed over the amplifier and modulator sections. Finally the wafer was thinned and AuGe contacts were formed on the thinned n-type substrate. After cleaving the wafer into bars, AR coatings were applied to both cleaved facets. The the bars were separated into discrete expanded beam amplifier-modulator (XBAM) chips.

Performance

Figure 16:
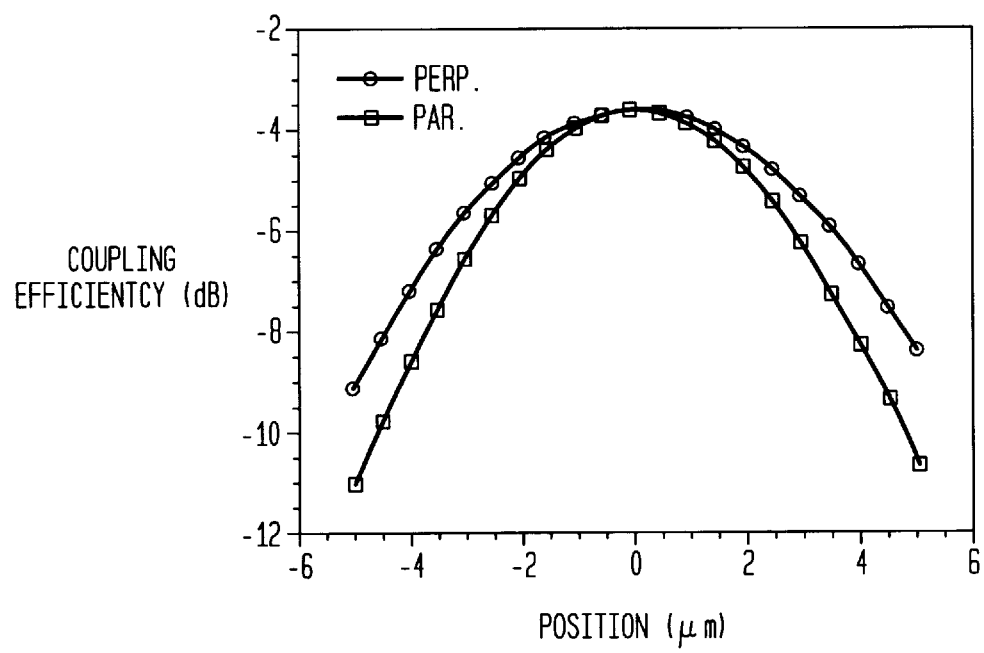
FIG. 16 is a graph showing the transverse coupling efficiency of an expanded beam output to a cleaved AR-coated single-mode fiber as a function of alignment.
Figure 17:
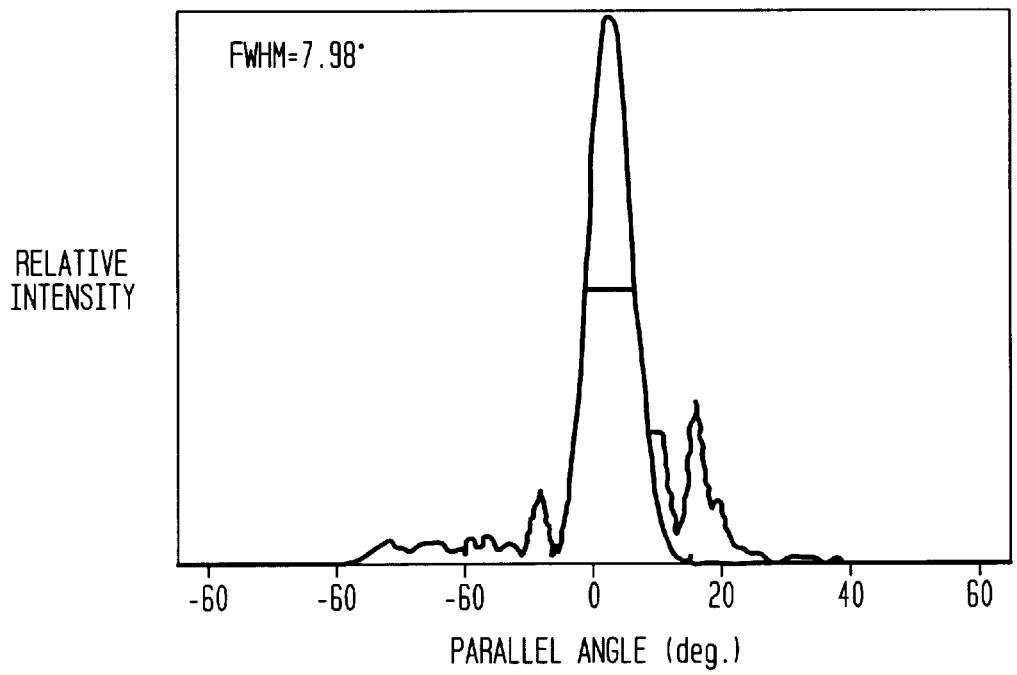
FIGS. 17–18 are graphs of far-field patterns parallel and perpendicular to the junction, respectively, of an expanded beam output facet of an uncoated device operating as 1550 nm Fabry-Perot laser.
Figure 18:
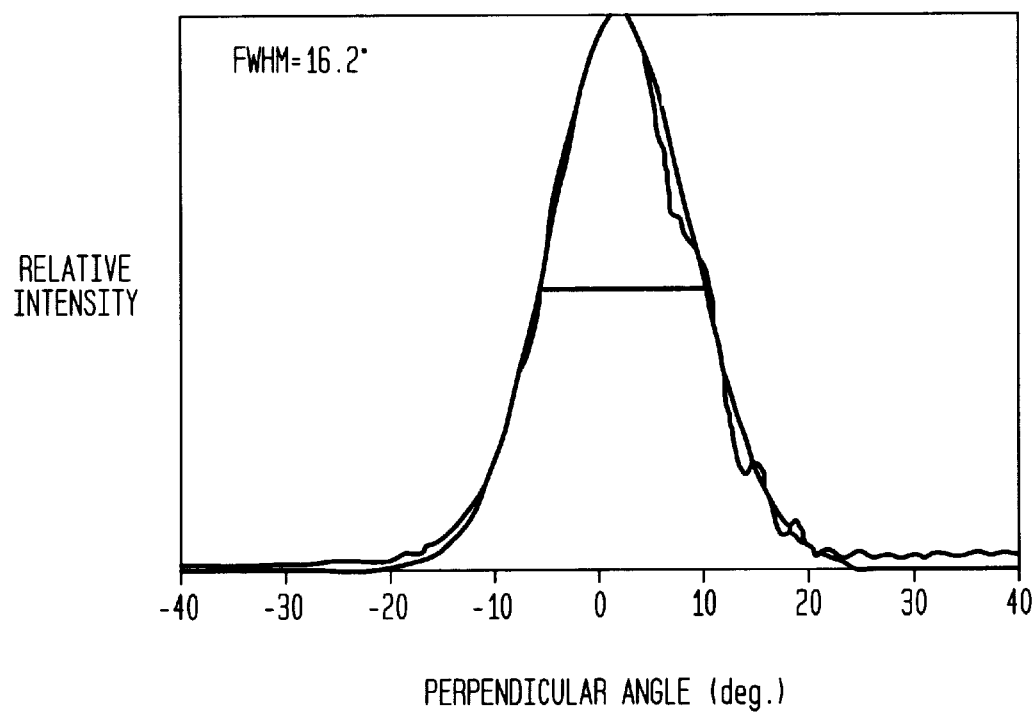

In order to mimic as closely as possible the coupling conditions that are found in hybrid wavelength selectable lasers, our XBAM chips were tested using, at the input, a cleaved single mode fiber (SMF) that was AR coated for light at a wavelength of 1550 nm and, at the output, a lensed isolator fiber coupler. Input coupling efficiency is very important for the hybrid integration using passive alignment to an optical waveguide on a submount or to an optical fiber. The coupling efficiency was evaluated using an uncoated XBAM chip that operated as a 1.55 $\mu$m Fabry-Perot laser. As shown in FIG. 17–18, the beam expander reduces the beam divergence from more than about 35×35 degrees to about 8.0×16.2 degrees FWHM. The smaller beam divergence results in a coupling efficiency to cleaved SMF as high as about −3.65 dB, and a 1 dB misalignment tolerance of about ±2.2 $\mu$m in the direction parallel to the plane of the layers and about ±1.9 $\mu$m in the direction perpendicular to thereto, as shown in FIG. 16. The smaller beam divergence also reduces the sensitivity of the diffraction loss to the width of the gap between the laser and fiber to about 0.06 dB/$\mu$m. These alignment tolerances are within the capabilities of the equipment used to attach the chip to a silica planar lightguide circuit. The coupling efficiency of the non-expanded modulator output was about −6 dB with the optics used.

The low coupling losses of these devices resulted in greater than about 10 dB small-signal fiber-to-fiber gain and output power of about +4 dBm in saturation. The EA modulator exhibited a 3 dB modulation bandwidth of about 6 GHz and an extinction ratio of about 14.4 dB r.f. for about 2.4 $V_{p-p}$ drive voltage. This level of performance makes the device suitable for hybrid integration using low-cost passive alignment techniques for applications such as wavelength selectable transmitters.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A method of fabricating an optical waveguide, semiconductor device, which has an axis along which an optical beam propagates, comprising the steps of:

(a) forming a first semiconductor waveguide region having first and second sections of different thickness and an intermediate vertical taper section of varying thickness coupling said first and second sections to one another, said first waveguide region being effective to expand the size of said beam as it propagates from said first section to said second section, (b) forming a second semiconductor region on said first waveguide region, (c) etching said second region so as to form an essentially vertical first surface of length A–B which extends obliquely across said axis, (d) forming a third semiconductor region on said second region and over said first surface, and (e) etching an elongated mesa along said axis, said mesa extending through at least said second region and said first surface so as to form a second waveguide region having an oblique, essentially vertical second surface which has a length a–b<A–B and which is a subsection of said first surface, said second surface forming an asymmetric horizontal taper effective to optically couple said beam between said second waveguide region and said first waveguide region.

2. The invention of claim 1 further including the step (f) of forming a fourth semiconductor region over said mesa.

3. The invention of claim 1 wherein step (a) includes selective area epitaxial growth of said sections between elongated, spaced oxide layers on a semiconductor body.

4. The invention of claim 1 wherein step (b) comprises forming said second region to include an active region of a semiconductor laser.

5. The invention of claim 2 wherein steps (d) and (f) comprise forming said third and fourth regions to include cladding regions for said waveguide regions.

\* \* \* \* \*